USOO8803121B2

(12) United States Patent
Goux (10) Patent No.: US 8,803,121 B2
(45) Date of Patent: Aug. 12, 2014

(54) RESISTIVE MEMORY ELEMENT AND RELATED CONTROL METHOD

(75) Inventor: Ludovic Goux, Hannut (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/416,902

(22) Filed: Mar. 9, 2012

(65) Prior Publication Data
US 2012/0228578 A1 Sep. 13, 2012

(30) Foreign Application Priority Data

Mar. 9, 2011 (EP) ...................................... 11157426

(51) Int. Cl.
*H01L 45/00* (2006.01)
*H01L 21/8239* (2006.01)
(52) U.S. Cl.
USPC ........ 257/4; 438/382; 257/E45.001; 257/E21.645; 257/E21.004
(58) Field of Classification Search
None
See application file for complete search history.

(56) References Cited

U.S. PATENT DOCUMENTS

| 2003/0003674 | A1  | 1/2003  | Hsu et al. |
| 2004/0022100 | A1  | 2/2004  | Fuhrmann et al. |
| 2004/0156255 | A1* | 8/2004  | Tsukikawa .................... 365/206 |
| 2005/0269615 | A1  | 12/2005 | Goo et al. |
| 2007/0120128 | A1  | 5/2007  | Sato et al. |
| 2008/0247225 | A1* | 10/2008 | Liu ................................ 365/163 |
| 2008/0251827 | A1  | 10/2008 | Cheng et al. |
| 2009/0127608 | A1  | 5/2009  | Weis |
| 2010/0090187 | A1  | 4/2010  | Ahn et al. |
| 2010/0097835 | A1  | 4/2010  | Popp et al. |
| 2011/0037045 | A1* | 2/2011  | Fukumizu et al. ............. 257/3 |
| 2012/0294075 | A1* | 11/2012 | Toda ............................. 365/163 |

FOREIGN PATENT DOCUMENTS

| JP | 2008-34441 A | * | 2/2008 |
| JP | 2008034441   |   | 2/2008 |

OTHER PUBLICATIONS

European Search Report, European Patent Application No. 11157426.5 dated Jul. 29, 2011.

* cited by examiner

*Primary Examiner* — Fernando L Toledo
*Assistant Examiner* — Lawrence-Linh T Nguyen
(74) *Attorney, Agent, or Firm* — McDonnell Boehnen Hulbert & Berghoff LLP (57) ABSTRACT

Resistive memory elements and arrays of resistive memory elements are disclosed. In one embodiment, a resistive memory element includes a top electrode element lying in a plane parallel to a reference plane, and having, in perpendicular projection on the reference plane, a top electrode projection; a bottom electrode element lying in a plane parallel to the reference plane, and having, in perpendicular projection on the reference plane, a bottom electrode projection; and an active layer with changeable resistivity interposed between the top electrode element and the bottom electrode element. The top electrode projection and the bottom electrode projection overlap in an overlapping region that comprises a corner of the top electrode projection and/or a corner of the bottom electrode projection, and an area of the overlapping region constitutes less than 10% of a total projected area of the top electrode element and the bottom electrode element on the reference plane.

12 Claims, 9 Drawing Sheets

RESISTIVE MEMORY ELEMENT AND RELATED CONTROL METHOD

CROSS-REFERENCE TO RELATED APPLICATIONS

This application claims priority to European Patent Application Serial No. 11157426.5 filed Mar. 9, 2011, the contents of which are hereby incorporated by reference.

BACKGROUND

A resistive memory device, such as, for example, the electrically programmable resistive cross point memory device as described by Hsu et al., U.S. Patent Application Pub. No. 2003/0003674, is a non-volatile memory device that generally comprises an active layer capable of having its resistivity changed in response to an electrical signal, interposed between a plurality of conductive top and bottom electrodes. The active layer is usually made of a dielectric material, such as a colossal magnetoresistive (CMR) material or a high temperature superconducting (HTSC) material, which may be interposed between metal electrodes, for example, wire-shaped Pt-electrodes. At a cross point of a top electrode and a bottom electrode, a cross point referring to each position where a top electrode crosses a bottom electrode, the active layer has a programmable region with a resistivity that can change in response to an applied voltage. The memory effect of the resistive memory device lies in the voltage-controlled programming of the memory device into two distinct resistive states, related to the formation and disruption of a conductive filament through the programmable region. As the width of the conductive filament is believed to be in the range of nanometers, i.e., considerably smaller than the size of a resistive memory cell structure, the resistive memory device promises good scalability.

Figure 1:
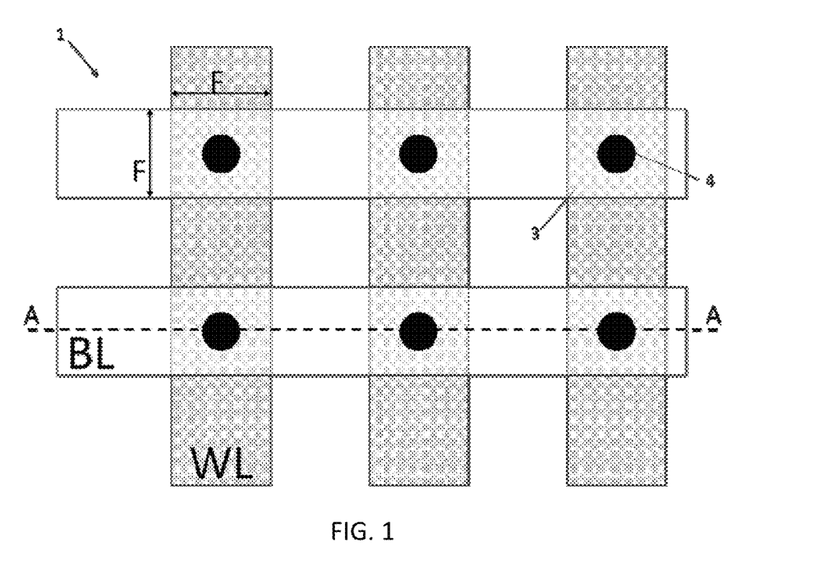
FIG. 1 is a top view of a typical resistive memory array with a cross-bar array configuration of the top electrodes and the bottom electrodes.
Figure 2:
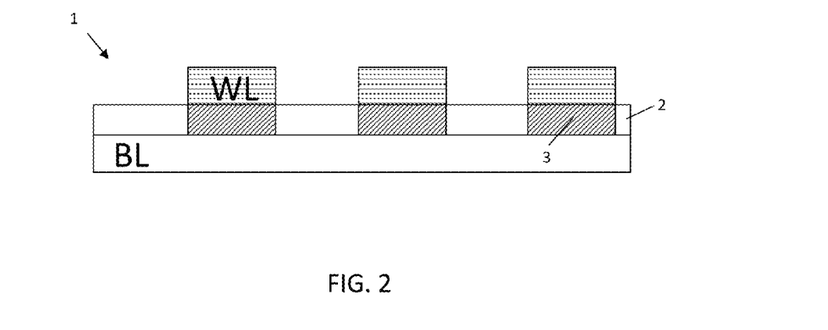
FIG. 2 is a cross-sectional view of the typical resistive memory array of FIG. 1, taken along section A-A in FIG. 1, in which the shaded zones are the programmable regions in the active layer with changeable resistivity.

A resistive memory array, comprising a plurality of resistive memory elements, typically comprises a cross-bar array of top and bottom electrodes as illustrated in top view in FIG. 1, and in cross-section in FIG. 2. The resistive memory device 1 comprises a plurality of top electrodes (e.g., word lines WL) and a plurality of bottom electrodes (e.g., bit lines BL) which, together with an active layer 2 between the top and bottom electrodes, form a plurality of cross-point memory elements. The active layer 2 is substantially continuous, such that the active layer 2 extends across more than one cross point. The active layer 2 is interposed between the plurality of word lines WL and bit lines BL. At each crossing of a word line WL with a bit line BL, a programmable region, i.e., a bit 3, is formed in the active layer 2.

The resistivity of the bit 3 can be changed due to filament formation or filament disruption in response to a voltage applied between the corresponding word line WL and the bit line BL. The position of the filaments are schematically indicated with closed circles 4 in FIG. 1. Supposing that the world lines WL and the bit lines BL each have a width F being the minimum width obtainable with a given technology, the density of the resistive memory device 1 can be calculated to be 1 filament/4 $F^2$, thus 1 bit/4 $F^2$.

SUMMARY

Because the width of the created filament is substantially smaller than the width F of the programmable region 3, there is room for new resistive memory elements that optimally utilize the small size of the filaments to create high density memory devices.

Disclosed are resistive memory elements having a voltage-controlled programmable resistive layer. Also disclosed are methods for voltage-controlled programming of a memory element or of a resistive memory array comprising a plurality of resistive memory elements.

The disclosed resistive memory element may allow for a controlled confinement of a conductive filament in an active layer with changeable resistivity. Further, the disclosed resistive memory elements may be used to provide a high density resistive memory array comprising a plurality of resistive memory elements. The disclosed methods may allow for an independent controllability of the memory filaments of the resistive memory array from the resistive memory array periphery.

In a first aspect, a resistive memory element is disclosed comprising a top electrode element lying in a plane parallel to a reference plane, and having, in perpendicular projection on the reference plane, a top electrode projection; a bottom electrode element lying in a plane parallel to the reference plane, and having, in perpendicular projection on the reference plane, a bottom electrode projection; and an active layer with changeable resistivity interposed between the top electrode element and the bottom electrode element. The disclosed resistive memory element further include an overlapping region between the top electrode projection and the bottom electrode projection, where the overlapping region comprises at least a corner of the top electrode projection and/or at least a corner of the bottom electrode projection and the area of the overlapping region constitutes not more than 10% of a total projected area of the top electrode element and the bottom electrode element on the reference plane.

In some embodiments, the overlapping region may comprise one corner of the top electrode projection and one corner of the bottom electrode projection. This allows the overlap region to be small and to comprise corners, hence the generated fields are large and a filament is more easily formed.

Further, in some embodiments the active layer with changeable resistivity may comprise a programmable region making contact with both the top electrode element and the bottom electrode element. In the programmable region, upon suitable actuation of the top electrode element and the bottom electrode element, the filaments are formed.

The active layer with changeable resistivity may be fabricated from an insulating material, such as for example perovskite-based oxides (e.g. $(Ba,Sr)TiO_3$, $(Pr,Ca)MnO_3$, etc.) or binary oxides of Ni, Al, Hf, Zr, Ti, Cu, etc., either doped or not.

In some embodiments, the top electrode element and/or the bottom electrode element may be made from metal. In other embodiments, the top and/or the bottom electrode element may be made from doped semiconductor material, such as, for example, doped Si. In some embodiments, one of the electrodes may make a Schottky contact with the active layer with changeable resistivity.

In some embodiments, the top electrode element and the bottom electrode element may be box-shaped electrode elements. Such box-shaped electrode elements may have corners where high fields are generated, allowing filaments to be more easily formed.

In a second aspect, a resistive memory array is disclosed comprising a plurality of the resistive memory elements described above. The resistive memory elements of a resistive memory array may comprise a top electrode element lying in a plane parallel to a reference plane, and having, in perpendicular projection on the reference plane, a top electrode projection; a bottom electrode element lying in a plane parallel to the reference plane, and having, in perpendicular projection on the reference plane, a bottom electrode projection; and an active layer with changeable resistivity interposed between the top electrode element and the bottom electrode element. The resistive memory elements of a resistive memory array may further comprise a first overlapping region between the top electrode projection and the bottom electrode projection, the first overlapping region comprising at least a corner of the top electrode projection and/or at least a corner of the bottom electrode projection. The area of the first overlapping region may constitute not more than 10% of a total projected area of the top electrode element and the bottom electrode element on the reference plane.

In some embodiments, the projected area of a first resistive memory element of the resistive memory array may overlap with the projected area of a second resistive memory element of the resistive memory array thereby forming a second overlapping region. The second overlapping region comprises at least one corner of the top electrode projection of the first restive memory element and one corner of the bottom electrode projection of the second resistive memory element, or vice versa. The area of the second overlapping region constitutes not more than 5% of the total projected area of the first and the second resistive memory element on the reference plane. In these embodiments, memory elements itself overlap, but the overlap is small.

In some embodiments, the top electrode elements and the bottom electrode elements of the resistive memory elements may be arranged in a checkerboard pattern.

In some embodiments, the resistive memory elements of a resistive memory array may further comprise a first level of bottom electrode programming lines electrically contacting some of the bottom electrode elements via a plurality of bottom electrode contacts, a second level of bottom electrode programming lines electrically contacting other bottom electrode elements via a plurality of bottom electrode contacts, the bottom electrode programming lines of the first level extending in a first direction and the bottom electrode programming lines of the second level extending in a second direction, a third level of top electrode programming lines electrically contacting some of the top electrode elements via a plurality of top electrode contacts, a fourth level of top electrode programming lines electrically contacting other top electrode elements via a plurality of top electrode contacts, the top electrode programming lines of the third level extending in a third direction and the top electrode programming lines of the fourth level extending in a fourth direction. Due to an intelligent layout of programming lines and contacts to these programming lines, filaments may be generated or disrupted to a plurality of corners of memory elements, while being separately controllable.

In some embodiments, the bottom electrode programming lines of the first level and the bottom electrode programming lines of the second level may be perpendicularly crossing, the top electrode programming lines of the third level and the top electrode programming lines of the fourth level are perpendicularly crossing. The top electrode programming lines of the third level and the top electrode programming lines of the fourth level may furthermore make an angle of approximately 45° with the bottom electrode programming lines of the first level and with the bottom electrode programming lines of the second level.

In some embodiments, the resistive memory elements of a resistive memory array may further comprise a fifth level of top electrode programming lines electrically contacting some of the top electrode elements via a plurality of top electrode contacts, the top electrode programming lines of the fifth level extending in a fifth direction.

Alternatively or additionally, the resistive memory elements of a resistive memory array may further comprise a sixth level of bottom electrode programming lines electrically contacting some of the bottom electrode elements via a plurality of bottom electrode contacts, the bottom electrode programming lines of the sixth level extending in a sixth direction.

In some embodiments, the programming lines may be wire-shaped programming lines. These are easy to manufacture, for example, by means of standard technology. Alternatively, in some embodiments, the programming lines may be staircase-like connection lines. Such lines may be implemented to avoid slanted lines which are difficult to manufacture properly.

In a third aspect, a method for voltage-controlled programming of a resistive memory array is disclosed. The resistive memory array may, for example, take any of the forms described above. The method comprises creating or disrupting at least one conductive filament in the active layer with changeable resistivity of the resistive memory array by applying a voltage to at least one top electrode element and at least one bottom electrode element of the resistive memory array which have an overlapping region between projections thereof on the reference plane.

In some embodiments, the method may furthermore comprise independently controlling the creation and the disruption of filaments at different corners between a top electrode element and a plurality of bottom electrode elements which, in perpendicular projection on the reference plane, overlap with the perpendicular projection of the top electrode element thereon, or at different corners between a bottom electrode element and a plurality of top electrode elements which, in projection on the reference plane, overlap with the perpendicular projection thereon of the bottom electrode element.

Particular aspects of the invention are set out in the accompanying independent and dependent claims. Features from the dependent claims may be combined with features of the independent claims and with features of other dependent claims as appropriate and not merely as explicitly set out in the claims.

While certain objects and advantages of the invention have been described herein above, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The drawings are only schematic and are non-limiting. In the drawings, the size of some of the elements may be exaggerated and not drawn on scale for illustrative purposes.

Any reference signs in the claims shall not be construed as limiting the scope. In the different drawings, the same reference signs refer to the same or analogous elements.

DETAILED DESCRIPTION

Figure 3:
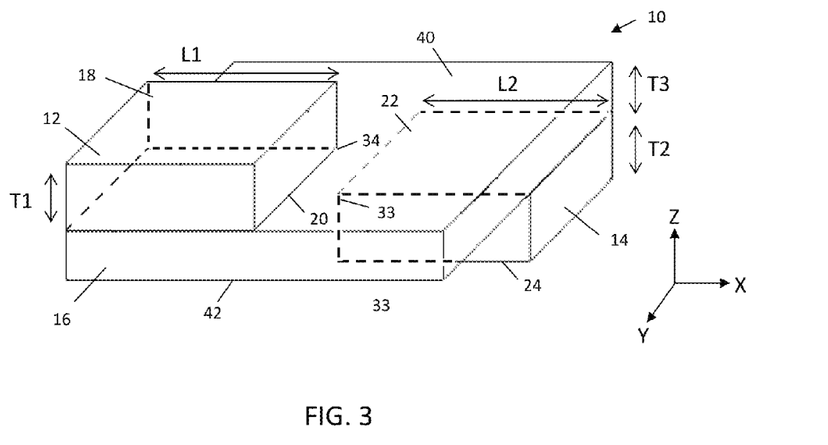
FIG. 3 is a three-dimensional view of a resistive memory element, in accordance with an embodiment.

FIG. 3 is a three-dimensional view of a resistive memory element 10, in accordance with an embodiment. The resistive memory element 10 comprises a top electrode element 12, a bottom electrode element 14 and an active layer with changeable resistivity 16 interposed between the top electrode element 12 and the bottom electrode element 14. As illustrated in FIG. 3, the top electrode element 12 of the resistive memory element 10 may comprise a first top surface 18 and a first bottom surface 20, the first top surface 18 and the first bottom surface 20 being, for example, substantially parallel to one another. The first top surface 18 may be oriented away from the active layer with changeable resistivity 16 and the first bottom surface 20 may be oriented towards the active layer with changeable resistivity 16. The first top surface 18 and the first bottom surface 20 of the top electrode element 12 may for example be parallel to a reference plane, for example a horizontal (X,Y)-plane as illustrated in FIG. 3. Similarly, the bottom electrode element 14 of the resistive memory element 10 may comprise a second top surface 22 and a second bottom surface 24, the second top surface 20 and the second bottom surface 24 being for example substantially parallel to one another. The second top surface 22 may be oriented away from the active layer with changeable resistivity 16 and the second bottom surface 24 may be oriented towards the active layer with changeable resistivity 16. The second top surface 22 and the second bottom surface 24 of the bottom electrode element 14 may, for example, be parallel to the reference plane, e.g. a horizontal (X,Y)-plane.

In some embodiments, the top electrode element 12 may for example be a box-shaped top electrode element with a first thickness T1, which may for example range between 5 nm and 10 nm. In general the first thickness T1 may be less than F for patterning purposes, where F is the minimum feature size obtainable in a given technology. The box-shaped top electrode element 12 may for example have a square first top surface 18 and a square first bottom surface 20, the square first top surface 18 and the square first bottom surface 20 for example both having a first side length L1, which may for example take a value in a range from 5 to 15 nm (or in general, 0.5*F<actual minimal feature size<1.5*F, but integration people usually find tricks to bring the actual minimal feature size on a wafer lower than F; the lower the actual minimal feature size the better for, e.g., memory density).

Similarly, in some embodiments, the bottom electrode element 14 may for example be a box-shaped bottom electrode element with a second thickness T2, which may for example range between 5 nm and 10 nm. The box-shaped bottom electrode element 14 may for example have a square second top surface 22 and a square second bottom surface 24. The square second top surface 22 and the square second bottom surface 24 may for example both have a second side length L2, which may for example take a value in a range from 5 to 15 nm. The dimensions of the bottom and the top electrode elements 12, 14, e.g. the first thickness T1 and the second thickness T2, or e.g. the first side length L1 and the second side length L2, may be either equal to or different from one another.

In other embodiments, the top electrode element 12 may for example have a rectangular (not square) top surface and a rectangular (not square) bottom surface. Similarly, the bottom electrode element 14 of a resistive memory element 10 according to some embodiments may for example have a rectangular (not square) top surface and a rectangular (not square) bottom surface.

The top electrode element 12 and the bottom electrode element 14 may be formed of materials generally used for forming electrodes in the semiconductor industry. Such materials for forming electrodes are conductive materials, such as for example aluminum, platinum, tungsten, copper, silver, gold, conductive oxides (e.g. $SrRuO_3$, $IrO_2$, $RuO_2$, etc.), conductive nitrides (e.g. TiN, TaN, etc.) or any other suitable conductive material. Materials used to manufacture the top electrode element 12 and the bottom electrode element 14 may be either equal to one another or different from each other. In some embodiments, the bottom electrode element 14 may for example be formed of platinum, whereas the top electrode element 12 may for example comprise platinum, copper, silver or gold.

In some embodiments, the top electrode element 12 and the bottom electrode element 14 of the resistive memory element 10 may be placed above one another, i.e., on top of each other, in such way that a perpendicular projection 26 of the top electrode element 12 on a reference plane, e.g., a horizontal (X,Y) plane, partially overlaps with a perpendicular projection 28 of the bottom electrode element 14 on the reference plane, e.g., the horizontal (X,Y) plane. The overlapping of the top electrode projection 26 with the bottom electrode projection 28 gives rise to an overlapping region 30. In some embodiments, the overlapping region 30 may comprise at least one corner of the top electrode projection 26 or at least one corner of the bottom electrode projection 28. The top electrode element 12 and the bottom electrode element 14 may furthermore be arranged in such way that the area of the overlapping region 30 constitutes not more than 10% of the total projected area of the top electrode element 12 and the bottom electrode element 14 on the reference plane, for example the horizontal (X,Y)-plane.

Figure 4:
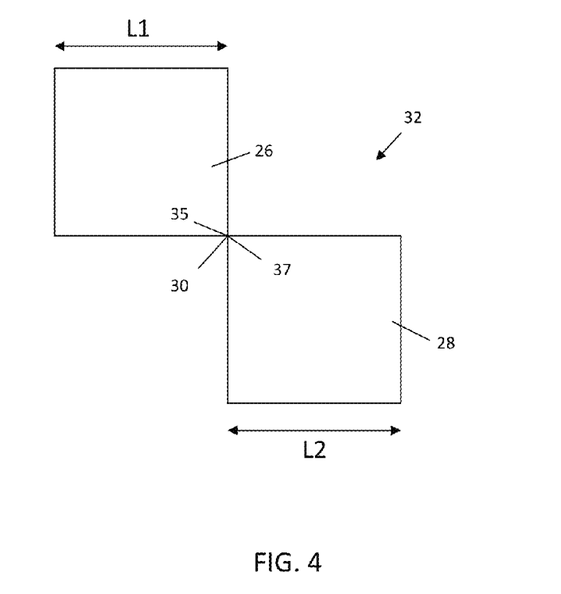
FIG. 4 illustrates the projected area of the resistive memory element of FIG. 3 on a reference plane, such as a horizontal (X,Y)-plane, in accordance with an embodiment.

FIG. 4 shows the projection 26 of the top electrode element 12 on the reference plane, e.g. the (X,Y)-plane, and the projection 28 of the bottom electrode element 14 of a resistive memory element 10 on the reference plane, e.g. the (X,Y)-plane, according to the embodiment illustrated in FIG. 3. The total projected area of the top electrode element 12 and the bottom electrode element 14 on the reference plane, e.g. the (X,Y)-plane, will be further referred to as the projected area 32 of the resistive memory element 10. When projected onto the reference plane, e.g. the horizontal (X,Y)-plane, the projection 26 of the top electrode element 26 and the projection 28 of the bottom electrode element 28 partially overlap thereby forming an overlapping region 30. Since, in the embodiment considered, the bottom electrode element 14 of the resistive memory element 10 illustrated in FIG. 3 has exactly one corner 33 placed underneath a corner 34 of the top electrode element 12, the overlapping region 30 comprises both the projection 35 of the top electrode corner 34 on the reference plane, e.g. the (X,Y)-plane, and the projection 37 of the bottom electrode corner 33 on the reference plane, e.g. the (X,Y)-plane, and constitutes a minimal fraction of the total projected area 32 of the resistive memory element 32, less than 10%, for example less than 1%.

Figure 5:
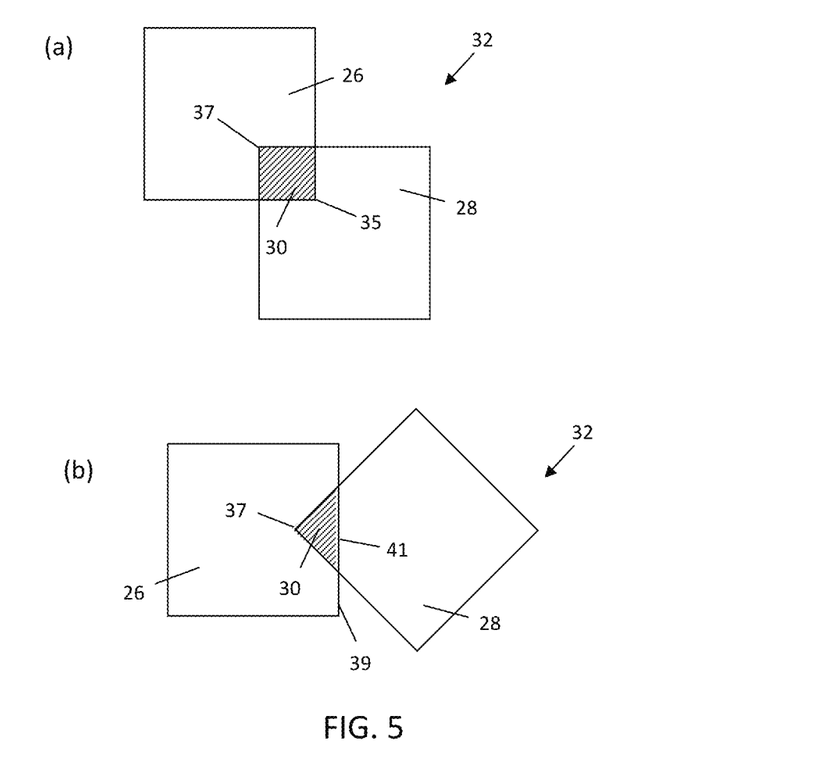
FIG. 5 shows the projected areas of a resistive memory element in which the shaded zones indicate the overlapping regions, in accordance with an embodiment.

FIG. 5 shows several other possible projected areas 32 of a resistive memory element 10 according to some embodiments. In FIG. 5(*a*), the top electrode element 12 and the bottom electrode element 14 of the resistive memory element 10 are arranged in such way that the overlapping region 30 of the top electrode projection 26 and the bottom electrode projection 28 constitutes less than 10%, for example, approximately 8% of the total projected area 32 and comprises exactly one corner 35 of the top electrode projection 26 and one corner 37 of the bottom electrode projection 28. Similarly, in FIG. 5(*b*), part of the bottom electrode element 14 may for example be placed beneath a middle portion of a side wall of the top electrode element 12, such that the overlapping region 30 comprises both the projection 37 of the bottom electrode corner 33 on the reference plane, e.g. the (X,Y)-plane, and the projection 41 of the middle portion of an edge 39 of the top electrode projection 26 on the reference plane, e.g. the (X,Y)-plane.

The active layer with changeable resistivity 16 interposed between the top electrode element 12 and the bottom electrode element 14 may be formed of a material capable of having its resistance changed in response to an applied voltage. For example, the active layer with changeable resistivity may be formed of at least one of binary oxides of Ni, Al, Hf, Zr, Ti, Cu, etc. either doped or not, or complex oxides like ternary oxides or perovskite-based oxides (typically (Ba,Sr)TiO$_3$, (Pr,Ca)MnO$_3$, etc. As illustrated in FIG. 3, the active layer with changeable resistivity 16 may have a third thickness T3 which may for example range between about 2 nm and 10 nm using again the aggressive F=10 nm, or in general T3<F. The active layer with changeable resistivity 16 may have a third top surface 40, for example being parallel to the reference plane, e.g., a horizontal (X,Y)-plane, which may contact the first bottom surface 20 of the top electrode element 12, for example the entire bottom surface 20 of the top electrode element 12. Similarly, the active layer with changeable resistivity 16 may have a third bottom surface 42, for example being parallel to the third top surface 40, which may contact the second top surface 22 of the bottom electrode element 14, for example the entire top surface 22 of the bottom electrode element 14.

Figure 6:
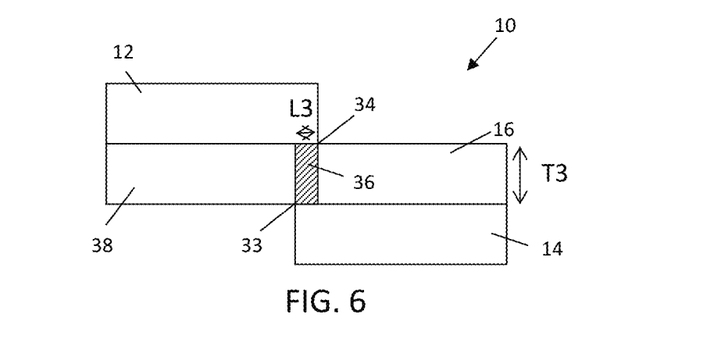
FIG. 6 is a cross-sectional view of a resistive memory element in which the shaded zone indicates the programmable region of the active layer with changeable resistivity, in accordance with an embodiment.

In some embodiments, the active layer with changeable resistivity 16 may furthermore comprise a programmable region 36 (as illustrated in FIG. 6) and a bulk region 38. The programmable region 36 is that portion of the active layer with changeable resistivity 16 which makes contact with both the top electrode element 12 and the bottom electrode 14, i.e. the region through which a voltage applied to the top electrode element 12 and the bottom electrode element 14 passes. The programmable region 36 may be determined by the overlap region of the perpendicular projection of the top and bottom electrode elements 12, 14 on the reference plane, e.g. the (X,Y)-plane. The bulk region 38 of the active layer with changeable resistivity 16 is then defined as that part of the active layer with changeable resistivity 16 different from the programmable region 36. When looked upon from a perpendicular projection on the reference plane, e.g. the (X,Y)-plane, it is the region which contacts either only the top surface 22 of the bottom electrode element 14, the bottom surface 20 of the top electrode element 12, or none of both.

FIG. 6 shows a cross-sectional view of a resistive memory element 1, in accordance with an embodiment. The programmable region 36 of the active layer with changeable resistivity 16 extends from the corner 34 of the top electrode element 12, down to the bottom electrode element 14, and from the corner 33 of the bottom electrode element 14 up to the top electrode element 12. The dimensions of the programmable region 36, e.g. the dimension of a third side length L3 as indicated in FIG. 6, may depend on the overlapping of the top electrode element 12 with the bottom electrode element 14, and does not need to be the same for every cross-section of the memory element 10. The programmable region 36 can be activated, i.e. its resistance changed, by applying an electrical signal such as a voltage or a current to the bottom electrode element 14 and to the top electrode element 16, such that the programmable region 36 acts as a variable resistor from which the resistance can be changed between at least two resistance values by the creation or the disruption of a conductive filament. Due to the limited overlapping of the top electrode element 12 with the bottom electrode element 14, a controlled confinement of the conductive filament in the active layer with changeable resistivity 16 may be achieved. Confinement of the conduction paths of the conductive filaments to precise locations will allow reducing the dispersion of operating voltages and currents.

In some embodiments, the disclosed resistive memory element 10 may be incorporated in a resistive memory array 44, which may comprise a plurality of resistive memory elements 10. The resistive memory elements 10 may be arranged in an array according to a pattern, e.g. a regular or irregular pattern. For example, the resistive memory elements 10 may be logically organized in rows and columns. Throughout this description, the terms "horizontal" and "vertical" (related to the terms "row" and "column" respectively) are used to provide a co-ordinate system and for ease of explanation only. The term "horizontal" when referring to the term "row" has a different meaning that the term "horizontal" when referring to the reference plane or the orientation of layers. The terms "horizontal" and "vertical" when referring to "rows" and "columns" do not need to, but may, refer to an actual physical direction of the device, when the term "horizontal" when referring to the reference plane or orientation of the layers does so. Furthermore, the terms "column" and "row" are used to describe sets of array elements which are linked together. The linking can be in the form of a Cartesian array of rows and columns. As will be understood by those skilled in the art, columns and rows can be easily interchanged and it is intended in this disclosure that these terms be interchangeable. Also, non-Cartesian arrays may be constructed. Accordingly the terms "row" and "column" should be interpreted widely. To facilitate in this wide interpretation, reference is made to "logically organised in rows and columns". By this is meant that sets of resistive memory elements 10 are linked together in a topologically linear intersecting manner; however, that the physical or topographical arrangement need not be so. For example, the rows may be circles and the columns radii of these circles and the circles and radii are described as "logically organized" rows and columns. Also, specific names of the various lines, e.g. reset line and first and second select line, are intended to be generic names used to facilitate the explanation and to refer to a particular function and this specific choice of words is not intended to in any way limit the invention. It should be understood that all these terms are used only to facilitate a better understanding of the specific structure being described, and are in no way intended to limit the invention.

Figure 7:
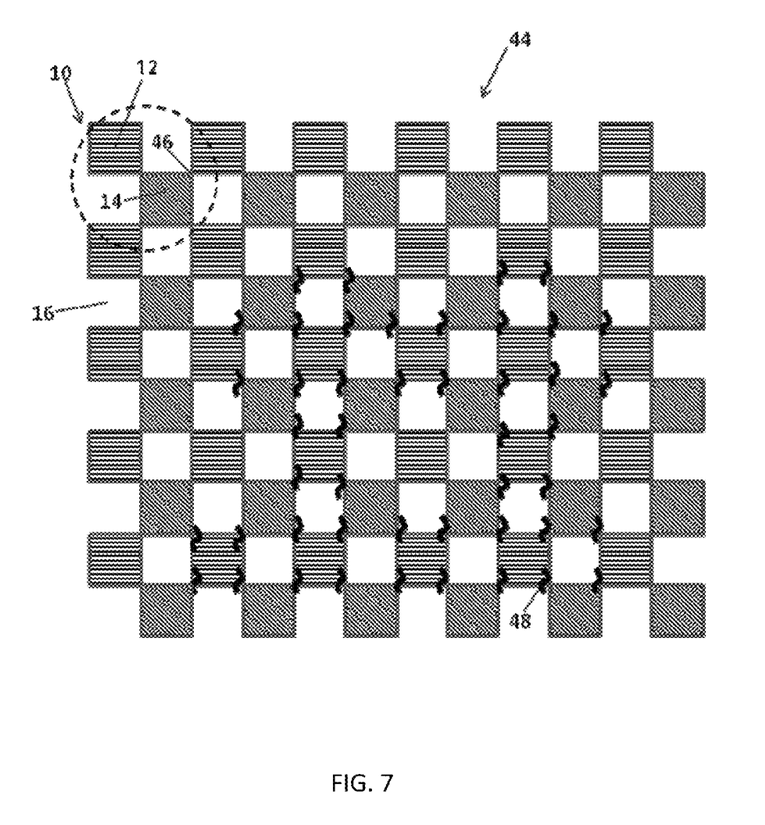
FIG. 7 is a top view of a resistive memory array in which the dashed circle indicates a single resistive memory element and the curls represent several possible locations of conductive filaments in the active layer with changeable resistivity of the resistive memory array, in accordance with an embodiment.

FIG. 7 is a top view of a resistive memory array 44 in which the dashed circle indicates a single resistive memory element 10 and the curls represent several possible locations of conductive filaments in the active layer with changeable resistivity of the resistive memory array, in accordance with an embodiment. The resistive memory elements 10 of the resistive memory array 44 may, for example, be arranged in such way that the projected area 32 of each memory element 10 on a reference plane, e.g. a horizontal (X,Y)-plane, overlaps with the projected area 32 of at least one other resistive memory element 10 of the resistive memory array 44. In some embodiments, the overlapping region formed by the projected areas of a first and a second neighboring resistive memory element may comprise or consist of exactly one corner of the projection 26 of the top electrode element 12 of the first resistive memory element 10 on the reference plane, e.g. the (X,Y)-plane, and one corner of the projection 28 of the bottom electrode element 14 of the second resistive memory element 10 on the reference plane, e.g. the (X,Y)-plane, or vice versa. Moreover, in some embodiments, the area of the overlapping region between two neighboring resistive memory elements may constitute not more than 5% of the total projected area of both neighboring resistive memory elements 10 on the reference plane, e.g. the (X,Y)-plane.

As illustrated in FIG. 7, the top electrode elements 12 and the bottom electrode elements 14 of the resistive memory elements 10 may, in top view, for example form a checkerboard pattern. The resistive memory elements 10 may be arranged on a substrate, which may be made from any suitable substrate material that may be used or upon which a resistive memory element may be formed, such as for example amorphous, polycrystalline or crystalline semiconductor materials, such as e.g. silicon (Si), germanium (Ge), silicon germanium (SiGe), gallium arsenide (GaAs), gallium arsenide phosphide (GaAsP), indium phosphide (InP). The substrate may include for example an insulating layer such as a $SiO_2$ or a $Si_3N_4$ layer in addition to a semiconductor substrate portion. Thus, the term substrate also includes e.g., silicon-on-glass or silicon-on sapphire substrates. The term substrate is thus used to define generally the elements for layers that underlie a layer or portions of interest, in particular a resistive memory element 10. Also, the substrate may be any other base on which a resistive memory element 10 is formed, for example a glass, quartz, fused silica or metal foil. Particular embodiments can be achieved by having suitable polymers as bulk and structural materials.

In the embodiment shown in FIG. 7, the resistive memory elements 10 are logically arranged in a Cartesian array comprising five equidistant rows of resistive memory elements 10 and six equidistant columns of resistive memory elements 10, thus forming a memory array 44. However, any suitable number of rows and columns may be used to form the resistive memory array 44. In one embodiment of a resistive memory array 44, the memory array 44 may for example be a 512×512 memory array. In yet alternative embodiments, the resistive memory elements 10 need not be arranged in a Cartesian array.

In some embodiments, the resistive memory elements 10 may be arranged in such way that the bottom surfaces 20 of the top electrode elements 12 are lying in one plane, e.g. a plane parallel to the reference plane, such as a horizontal plane parallel to the (X,Y)-plane. This plane will be further referred to as the plane of the top electrode elements 12 of the resistive memory array 44. Similarly, the top surfaces 22 of the bottom electrode elements 14 of a resistive memory array 44 according to some embodiments may also be lying in one plane, e.g. a lower-lying plane with respect to the plane of the top electrode elements 12. This plane will be further referred to as the plane of the bottom electrode elements 14 of the resistive memory array 44. The active layer with changeable resistivity 16, interposed between the top electrode element 12 and the bottom electrode element 14 of the resistive memory elements 10 may then be a continuous active layer with changeable resistivity 16, which may be interposed between the plane of the top electrode elements 12 and the plane of the bottom electrode elements 14 of the resistive memory array 44.

In the checkerboard array configuration illustrated in FIG. 7, the projected area 32 of any resistive memory element 10 not located at an edge of the array 44 overlaps with the projected area of six surrounding resistive memory elements 10. At the corners and the edges of the resistive memory array 44, the projected area 32 of the memory elements 10 overlaps with the projected area 32 of respectively three and four neighboring resistive memory elements 10. Each overlapping between the projected areas 32 of the resistive memory elements 10 gives rise to an overlapping region 46 which comprises exactly one corner of the bottom electrode projection 28 of a resistive memory element 10 on the reference plane, e.g. the (X,Y)-plane, and one corner of the top electrode projection 26 of a neighboring resistive memory element 10 on the reference plane, e.g. the (X,Y)-plane, or vice versa. By applying a voltage to the top electrode element 12 of a resistive memory element 10 and to the bottom electrode element 14 of a neighboring resistive memory element 10, or vice versa, the resistance of the active layer with changeable resistivity 16 may be locally changed and a new filament may be activated in the active layer with changeable resistivity 16. Several (but not all) possible locations of conductive filaments 48 are indicated with curls in FIG. 7. Each location of a filament 48 in the active layer with changeable resistivity 16 originates from the overlapping of a top electrode element 12 with a bottom electrode element 14, wherein the bottom electrode element 14 belongs either to the same resistive memory element 10 as the top electrode element 12, or to a neighboring resistive memory element 10.

Furthermore, in some embodiments, the top electrode elements 12 and the bottom electrode elements 14 of the resistive memory array 44 may be coupled, e.g. electrically coupled, to programming lines, thus forming a resistive memory device 70. The programming lines may be provided so as to allow applying a voltage to the top and bottom electrode elements 12, 14 for the creation or the disruption of conductive filaments 48 in the active layer with changeable resistivity 16. In some embodiments, the programming lines can be arranged in such a way that the creation or the disruption of each conductive filament 48 in the active layer with changeable resistivity 16 may be controlled independently from the resistive memory array periphery. Furthermore, in some embodiments, the programming lines can be arranged in such way that the density of the memory array 44 is as high as possible, e.g., higher than the density of a conventional resistive memory array, e.g., higher than a density of 1 filament/4 $F^2$ or 1 bit/4 $F^2$, with F being the width of the programming lines.

Figure 8:
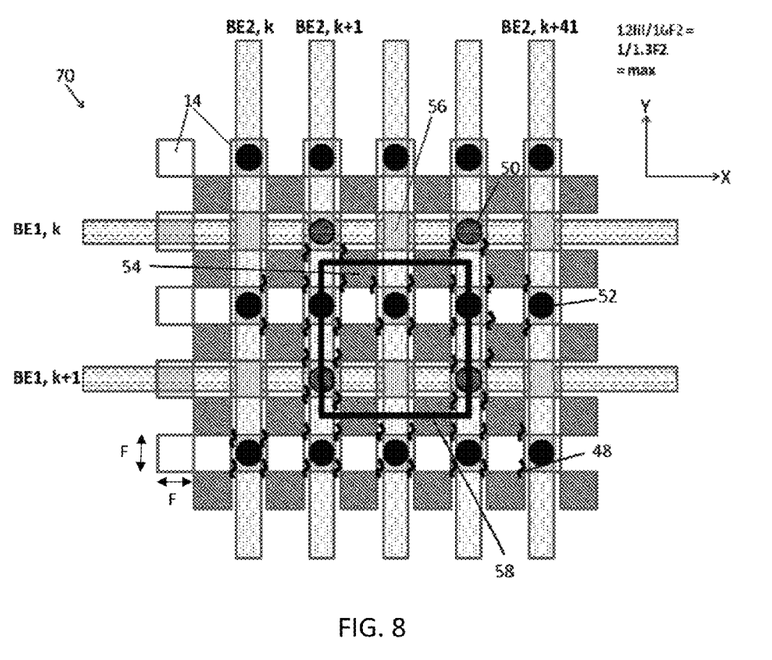
FIG. 8 is a top view of a resistive memory array comprising a first and a second level of programming lines contacting the bottom electrode elements, and a plurality of BE1 and BE2 contacts, in accordance with an embodiment.

In some embodiments, the resistive memory array 44 may comprise at least a first level of programming lines electrically contacting some of the bottom electrode elements 14 and a second level of programming lines electrically contacting other bottom electrode elements 14. FIG. 8 illustrates one possible configuration of a resistive memory device 70 comprising two levels of programming lines contacting the bottom electrode elements 14. For the sake of simplicity, the programming lines electrically contacting the top electrode elements 12 are not illustrated in FIG. 8. The programming lines of the first level, further called the BE1 lines, may be parallel to one another and extend in a first direction, e.g. the direction of a logical row, illustrated in FIG. 8 as the direction of the X-axis. The programming lines of the first level may have a wire shape, e.g. a shape which has a first dimension, e.g. length, much larger, e.g. at least 10 times larger, than a second, substantially perpendicular dimension, e.g. width or diameter. The BE1 lines may lie in a single plane, e.g. a plane parallel to the reference plane, for example a horizontal (X,Y)-plane, such as a horizontal (X,Y)-plane located underneath the plane of the bottom electrode elements 14. Each BE1 line may extend over a logical row, for example a horizontal row, of bottom electrode elements 14, e.g. a row of bottom electrode elements 14 of the resistive memory array 44 located along a horizontal axis parallel to the X-axis as illustrated in FIG. 8. There may be as many BE1 lines as there are logical rows of bottom electrodes 14. Alternatively, as illustrated in FIG. 8, only part of the bottom electrode rows, for example every second bottom electrode row, may be covered by BE1 lines. The plurality of first level programming lines contacting the bottom electrode elements 14 will be further denoted as BE1,1, . . . , BE1,k, BE1,k+1, BE1,k+2, BE1,k+3, . . . .

The second level of programming lines electrically contacting the bottom electrode elements 14, further called the BE2 lines, may be parallel to one another and extend in a second direction, the second direction for example being different from the first direction. In particular embodiments, the second direction may be perpendicular to the first direction in which the programming lines of the first level extend, e.g. the direction of a logical column, illustrated in FIG. 8 as the Y-axis. This way, the BE2 programming lines may for example be perpendicularly crossing the BE1 programming lines.

The BE2 lines may lie in a single plane, e.g. a plane parallel to the reference plane, for example a horizontal (X,Y)-plane, such as a horizontal (X,Y)-plane located in between the plane of the BE1 lines and the plane of the bottom electrode elements 14. Each BE2 line may extend over a logical column, for example a vertical column, of bottom electrode elements 14 of the resistive memory device 70, e.g. a column of bottom electrode elements 14 of the resistive memory device 70 located along a vertical axis parallel to the Y-axis as illustrated in FIG. 8. The number of BE2 lines may be equal to the number of bottom electrode logical columns as illustrated in FIG. 8, or the number of BE2 lines may be different from the number of bottom electrode logical columns. Only part of the bottom electrode logical columns, as an example for example every second bottom electrode column, may be covered by the BE2 lines. The plurality of second level programming lines contacting the bottom electrode elements 14 will be further denoted as BE2,1, . . . , BE2,k, BE2,k+1, BE2,k+2, BE2,k+3, . . . .

The BE1 lines and the BE2 lines may be fabricated from any suitable electrically conductive material, for example from a Si-doped material, or SiGe, Ge-doped . . . . Alternatively, the BE1 lines and the BE2 lines may be metal lines, such as for example W or Cu lines, and aluminum or gold lines.

In other embodiments, the direction in which the BE1 lines and the BE2 lines extend may be different from the embodiments set out above, e.g. the BE1 and BE2 lines do not need to be perpendicular to one another, and/or they do not need to be lined up with the logical rows and columns of the bottom electrode elements 14, e.g., they can be arranged in a slanted direction with respect to the logical rows and columns. Furthermore, the shape of the BE1 lines and the BE2 lines may be different from a wire shape.

In order to be able to apply a voltage to the bottom electrode elements 14 from the resistive memory array periphery, contact elements for making electrical contact may be provided between the BE1 lines and the bottom electrode elements 14 on one hand, and between the BE2 lines and the bottom electrode elements 14 on the other hand. The contact elements may have any suitable shape, for example a cylindrical shape. The top surface of the contact elements, e.g., a circular top surface, may be parallel to the plane of the bottom electrode elements 14. Also the bottom surface of the contact elements, e.g. a circular bottom surface, may be parallel to the plane of the bottom electrode elements 14. The contact elements may be made from any suitable electrically conductive material, for example, but not limited thereto, from the same material as the programming lines.

FIG. 8 illustrates various first contact elements 50 being interposed between the BE1 lines and the bottom electrode elements 14 and several second contact elements 52 being interposed between the BE2 lines and the bottom electrode elements 14.

Figure 9:
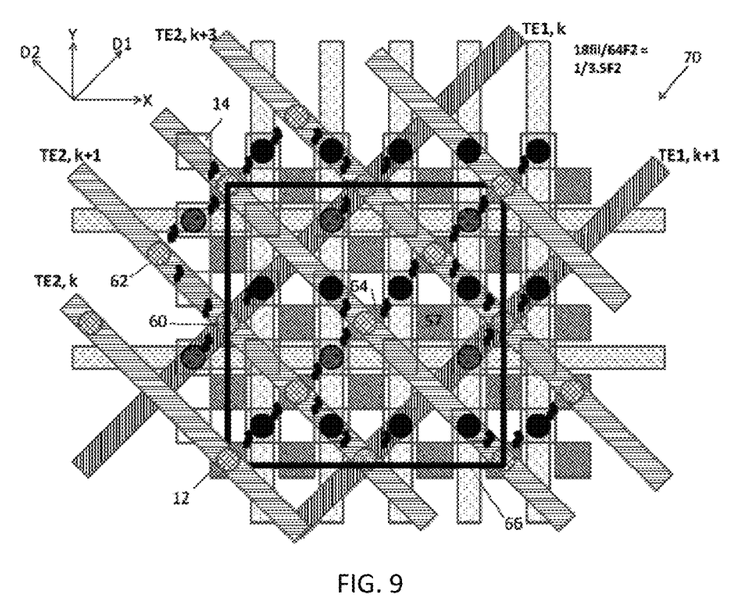
FIG. 9 is a top view of a resistive memory array illustrated in FIG. 8, furthermore comprising a first and a second level of programming lines contacting the top electrode elements, and a plurality of TE1 and TE2 contacts, in accordance with an embodiment.

In some embodiments, the resistive memory device 70 may furthermore comprise at least a third level of programming lines electrically contacting some of the top electrode elements 12 and a fourth level of programming lines electrically contacting other top electrode elements 12. FIG. 9 illustrates one possible configuration of a resistive memory device 70 comprising two levels of programming lines contacting the top electrode elements 12. Apart from the programming lines contacting the top electrode elements 12, the resistive memory device 70 illustrated in FIG. 9 furthermore shows a same configuration as the resistive memory device 70 of FIG. 8, including the same configuration of the top electrode elements 12 and the bottom electrode elements 14 of the resistive memory elements 10, as well as the same location of the BE1 lines and BE2 lines. The third level of programming lines contacting the top electrode elements 12, further called the TE1 lines, may be parallel to one another and extend in a third direction, e.g. a third direction including a non-zero angle with both the first direction of the BE1 lines and the second direction of the BE2 lines, e.g. a first diagonal direction with respect to the first direction of the BE1 lines and the second direction of the BE2 lines. The TE1 lines may lie in a single plane, e.g. a plane parallel to the reference plane, for example a horizontal (X,Y)-plane, such as a horizontal (X,Y)-plane located above the plane of the top electrode elements 12. Each TE1 line may for example extend over a diagonal row of top electrode elements 12, e.g. a row of top electrode elements 12 of the resistive memory array 44 located along a diagonal axis being parallel to a first diagonal axis D1 as illustrated in FIG. 9. There may be as many TE1 lines as there are rows of top electrodes 12 in the third direction, e.g. diagonal rows of top electrodes 12 in the D1 direction. Alternatively, as illustrated in FIG. 9, only part of the diagonal top electrode rows in the third direction, e.g. D1 direction, for example every second top electrode row, may be covered by TE1 lines. The plurality of third level programming lines contacting the top electrode elements 12 will be further denoted as TE1,1, . . . , TE1,k, TE1,k+1, TE1,k+2, TE1,k+3, . . . .

The fourth level of programming lines contacting the top electrode elements 12, further called the TE2 lines, may be parallel to one another and extend in a fourth direction, e.g. a fourth direction including a non-zero angle with both the first direction of the BE1 lines and the second direction of the BE2 lines, e.g. a second diagonal direction with respect to the first direction of the BE1 lines and the second direction of the BE2 lines. As illustrated in FIG. 9, the TE2 programming lines may for example perpendicularly cross the TE1 programming lines, and, similar as the TE1 programming lines, form an angle of approximately 45° with the BE1 and the BE2 programming lines. However, the direction wherein the TE1 lines and the TE2 lines extend may be different. The TE2 lines may lie in a single plane, e.g. a plane parallel to the reference plane, for example a horizontal (X,Y)-plane, such as a horizontal (X,Y)-plane located above the plane of the TE1 lines. Each TE2 line may extend over a row in the fourth direction, e.g. a diagonal row of top electrode elements 12 of the resistive memory array 44, such as a row of top electrode elements 12 located along a diagonal axis being parallel to a second diagonal axis D2 as illustrated in FIG. 9. The number of TE2 lines may be equal to the number of top electrode rows in the fourth direction, or, as illustrated in FIG. 9, the number of TE2 lines may be different from the number of top electrode rows in the fourth direction. The plurality of second level programming lines contacting the top electrode elements 12 will be further denoted as TE2,1, . . . , TE2,k, TE2,k+1, TE2,k+2, TE2,k+3, . . . . The TE1 lines and the TE2 lines may either be fabricated from the same material as the BE1 lines and the BE2 lines, or they may be fabricated from other materials. The TE1 lines and the TE2 lines may have any suitable shape in order to contact the top electrode elements 12, for example a wire shape.

In order to be able to apply a voltage to the top electrode elements 12 from the resistive memory array periphery, contact elements 60 for making electrical contact may be provided between the TE1 lines and some of the top electrode elements 12 on the one hand, and contact elements 62 for making electrical contact may be provided between the TE2 lines and other top electrode elements 12 on the other hand. The contact elements may have any suitable shape, for example a cylindrical shape. The bottom surface of the contact elements, e.g. a circular bottom surface, may be parallel to the plane of the top electrode elements 12. Also the top surface of the contact elements, e.g. a circular top surface, may be parallel to the plane of the top electrode elements 12. The contact elements may be made from any suitable electrically conductive material, for example, but not limited thereto, from the same material as the programming lines. FIG. 9 illustrates various contact elements 60 being interposed between the TE1 lines and the top electrode elements 12 and various contact elements 62 being interposed between the TE2 lines and the top electrode elements 12.

In some embodiments, the configuration of the first, second, third, and fourth levels of programming lines, their distribution over the memory array 44 and their electrical interconnections with the top and bottom electrode elements 12, 14 may be done as required to obtain an advantageous programmability of the memory elements.

In some embodiments, as illustrated in FIG. 9 and partially illustrated in FIG. 8, the arrangement of the first, second, third and fourth programming lines, and of the BE1 first contact elements 50, the BE2 second contact elements 52, the TE1 contact elements 60 and the TE2 contact elements 62 may be provided such that filaments 48 activated between the corners of a top electrode element 12 and the respective bottom electrode elements 14 with which these corners overlap in top view may be controlled independently from one another, e.g. by different BE1, BE2 and TE1, TE2 programming lines, respectively.

One possible configuration of the BE1 contacts 50 and the BE2 contacts 52 is illustrated in FIG. 8. In order to be able to independently control the filaments 48 activated at the different corners of a same top electrode element 12, several bottom electrode elements 14 may not be electrically contacting the BE1 lines nor the BE2 lines, and several top electrode elements 12 may not be electrically contacting the TE1 lines nor the TE2 lines.

In some embodiments, the TE1 contacts 60 and the TE2 contacts 62 may be provided such that each filament 48 generated or disrupted in the active layer with changeable resistivity 16 of the resistive memory array 44 may be controlled independently, i.e., by controlling a different combination of BE1, BE2, TE1 and TE2 programming lines. In order to realize this, several bottom electrode elements 14 and/or top electrode elements 12 may not be electrically contacting the BE1 nor BE2 and TE1 nor TE2 lines, i.e. not every top electrode element 12 may be provided with a TE1 contact 60 nor a TE2 contact 62 end not every bottom electrode element 14 may be provided with a BE1 contact 50 nor a BE2 contact 52. This is illustrated in FIG. 8 and FIG. 9. For a selected top electrode element 64, the conductive filament generated between the top left corner and the corresponding bottom electrode element with which the top electrode element 64 overlaps, is controlled by the BE2,k+1 and the TE2,k+2 programming lines, whereas the filament generated at the top right corner is controlled by the BE2,k+2 and the TE2,k+2 programming lines and the filament generated at the bottom left corner is controlled by the BE1,k+1 and the TE2,k+2 programming lines. Adding an additional contact element to the neighboring bottom right electrode element 57 of the top electrode element 64 would remove the independent controllability of the filaments 48 of the resistive memory array 44.

For the proposed configuration as illustrated in FIG. 9, the density of the resistive memory array 44 can be calculated to be 18 filaments/64 $F^2$, i.e. ~1 bit/3.5 $F^2$, thereby using a periodic unit element 66 of the resistive memory array 44 to calculate the memory array density and assuming a side length F of the top and bottom electrode elements. The periodic unit element 66 is the smallest subset of memory elements and their contact elements of the resistive memory device which, if tiled, leads to the resistive memory device 70.

In some embodiments, any other configuration of the programming lines BE1, BE2, TE1, TE2 may be used that allows for an independent controllability of the filaments 48 in the resistive memory device 70. Furthermore, any other configuration of the BE1, BE2, TE1, TE2 contacts that allows for an independent controllability of the filaments 48 in the resistive memory device 70 may be used.

Figure 10:
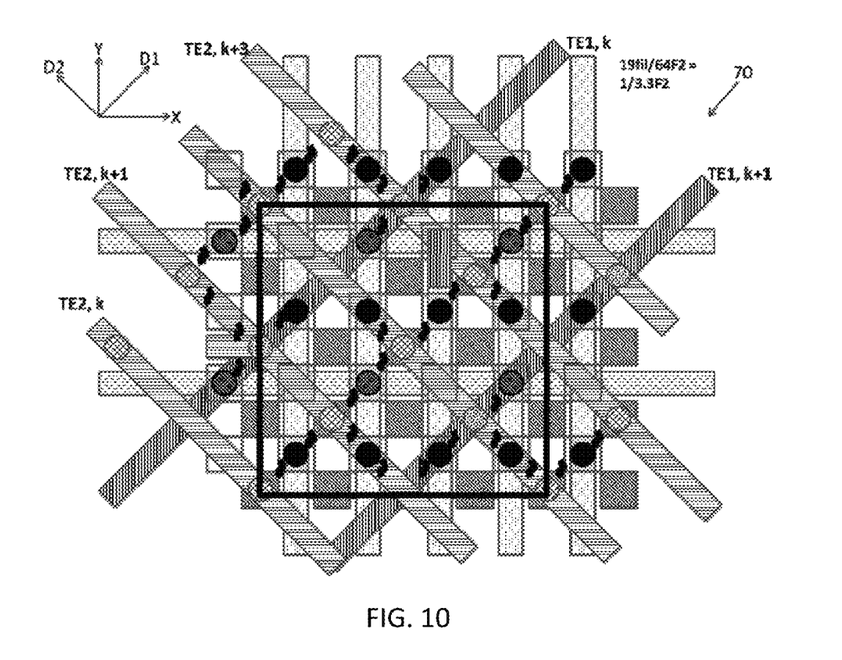
FIG. 10 is a top view of a resistive memory array in which the TE1 contacts are shifted with respect to the configuration illustrated in FIG. 9, in accordance with an embodiment.

FIG. 10 shows an alternative embodiment of a resistive memory array 44 in which the TE1 contacts of the TE1,k+1 programming lines are shifted with respect to the TE1 contacts of FIG. 9. For the proposed configuration as illustrated in FIG. 10, the density of the resistive memory array 44 can be calculated to be 19 filaments/64 $F^2$, i.e. ~1 bit/3.37 $F^2$, i.e. slightly larger than the density of the resistive memory device 70 of FIG. 9.

Figure 11:
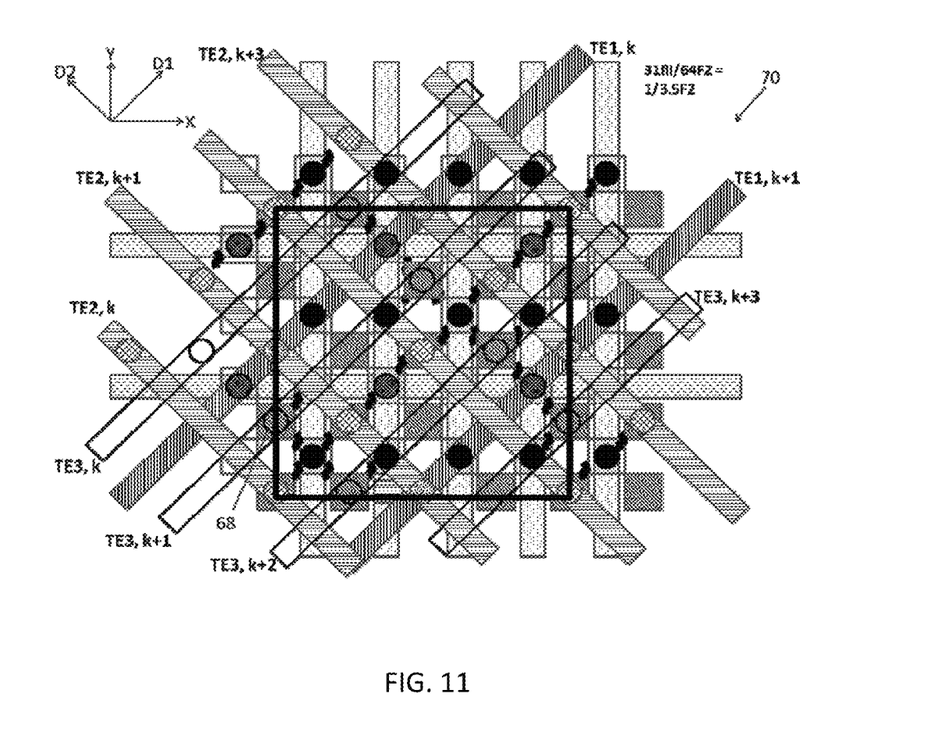
FIG. 11 is a top view of the resistive memory array illustrated in FIG. 9, furthermore comprising a third level of programming lines contacting the top electrode elements, in accordance with an embodiment.

FIG. 11 shows yet another alternative embodiment of a resistive memory array 44. As illustrated in FIG. 11, the resistive memory device 70 may be provided, on top of the third and fourth level of programming lines contacting the top electrode elements 12, with a fifth level of programming lines TE3 also contacting the top electrode elements 12. The TE3 lines may extend in a fifth direction, e.g. the same direction of the TE1 lines, and may lie in one plane, e.g. a plane parallel to the reference plane, such as a horizontal (X,Y)-plane, e.g. a horizontal (X,Y)-plane located above the plane of TE2 lines. The programming lines TE3 may be provided with TE3 contact elements 68 in order to electrically contact some of the top electrode elements 12. The TE3 lines may for example be interposed between the TE1 lines, thereby contacting several top electrode elements 12 of the resistive memory array 44 which were not yet contacted using the configurations as shown in FIG. 9 and FIG. 10. The use of a third level of programming lines TE3 considerably increases the density of the resistive memory array 44, which can be calculated to be 31 filaments/64 $F^2$, i.e. 1 bit/2 $F^2$. This is twice as large as the density of the typical cross-bar memory device of FIG. 1.

In the embodiment shown in FIG. 11, there are two levels of bottom electrode programming lines BE1, BE2 and three levels of top electrode programming lines TE1, TE2, TE3. In other embodiments, not explained here in detail, there may be three levels of bottom electrode programming lines BE1, BE2, BE3 and only two levels of top electrode programming lines TE1, TE2. In yet other embodiments, depending on the configuration of the resistive memory array, there may still be other numbers of levels of bottom and top electrode programming lines. The number of levels of bottom electrode programming lines does not need to be equal to the number of levels of top electrode programming lines.

Figure 12:
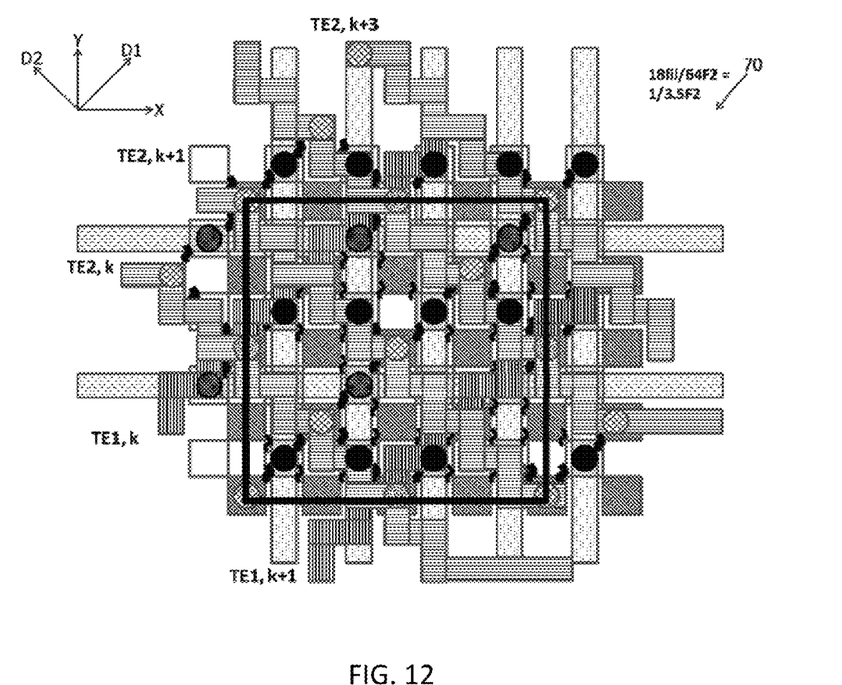
FIG. 12 is a top view of the resistive memory array illustrated in FIG. 9, wherein the diagonal TE1 and TE2 programming lines are replaced by staircase-like TE1 and TE2 connection lines, in accordance with an embodiment.

Rather than using straight programming lines, e.g. BE1, BE2, BE3, TE1, TE2 and/or TE3 programming lines, extending in a diagonal direction with respect to the direction of the logical rows and columns of memory elements, staircase-like programming lines may be used. FIG. 12 illustrates a memory device configuration 70 as in FIG. 9, wherein the TE1 and the TE2 programming lines are replaced by staircase-like TE1 and TE2 programming lines. The embodiment illustrated in FIG. 12 may allow the use of diagonal programming lines to be avoided, thereby allowing for a more conventional way of fabricating the resistive memory device 70 without affecting its density.

The configuration of the programming lines and the contact elements can be optimized in order to increase the density of the memory device 70 without losing the independent controllability of the filaments 48. The resistive memory device 70 may for example have a density which is higher than the density of typical cross-bar memory devices, e.g. higher than 1 bit/4 $F^2$, e.g. 1 bit/2 $F^2$.

A resistive memory array 44 may be particularly useful for the creation of resistive memory devices comprising an active layer with changeable resistivity 16 which requires a high processing temperature, for example an active layer with changeable resistivity 16 made from a perovskite material. Perovskite materials are not suited for three-dimensional stacking (processing on top of back end of the line metal lines), but in some embodiments a resistive memory device using Perovskite materials and having a high density may be obtained.

While the invention has been illustrated and described in detail in the drawings and foregoing description, such illustration and description are to be considered illustrative or exemplary and not restrictive. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to include any specific characteristics of the features or aspects of the invention with which that terminology is associated.

The invention claimed is:

1. A resistive memory array comprising:
   a plurality of resistive memory elements, each resistive memory element comprising:
   a top electrode element lying in a plane parallel to a reference plane, and having, in perpendicular projection on the reference plane, a top electrode projection;
   a bottom electrode element lying in a plane parallel to the reference plane, and having, in perpendicular projection on the reference plane, a bottom electrode projection;
   an active layer with changeable resistivity interposed between the top electrode element and the bottom electrode element, wherein:
   the top electrode projection and the bottom electrode projection overlap in an overlapping region that comprises at least one of a corner of the top electrode projection and a corner of the bottom electrode projection, and
   an area of the overlapping region constitutes less than 10% of a total projected area of the top electrode element and the bottom electrode element on the reference plane;
   a first level of bottom electrode programming lines electrically contacting some of the bottom electrode elements via a plurality of first bottom electrode contacts;
   a second level of bottom electrode programming lines electrically contacting some of the bottom electrode elements via a plurality of second bottom electrode contacts;
   the bottom electrode programming lines of the first level extending in a first direction and the bottom electrode programming lines of the second level extending in a second direction;
   a third level of bottom electrode programming lines electrically contacting some of the top electrode elements via a plurality of third top electrode contacts;
   a fourth level of bottom electrode programming lines electrically contacting some of the top electrode elements via a plurality of fourth top electrode contacts;
   the top electrode programming lines of the third level extending in a third direction and the top electrode programming lines of the fourth level extending in a fourth direction; and the top electrode programming lines of the third level and the top electrode programming lines of the fourth level are perpendicularly crossing.

2. The resistive memory array of claim 1, wherein:
the overlapping region comprises a first overlapping region;
a projected area of a first resistive memory element overlaps with a projected area of a second resistive element in a second overlapping region that comprises at least one of a corner of the top electrode projection of the first resistive memory element and a corner of the bottom electrode projection of the second resistive memory element, and a corner of the top electrode projection of the second resistive memory element and a corner of the bottom electrode projection of the first resistive memory element; and
an area of the second overlapping region constitutes less than 5% of a total projected area of the first resistive memory element and the second resistive memory element on the reference plane.

3. The resistive memory array of claim 1, wherein the top electrode elements and the bottom electrode elements are arranged in a checkerboard pattern.

4. The resistive memory array of claim 1, wherein the bottom electrode programming lines of the first level and the bottom electrode programming lines of the second level are perpendicularly crossing.

5. The resistive memory array of claim 1, wherein:
the top electrode programming lines of the third level and the top electrode programming lines of the fourth level make an angle of 45° with the bottom electrode programming lines of the first level and the bottom electrode programming lines of the second level.

6. A resistive memory array comprising:
a plurality of resistive memory elements, each resistive memory element comprising:
a top electrode element lying in a plane parallel to a reference plane, and having, in perpendicular projection on the reference plane, a top electrode projection;
a bottom electrode element lying in a plane parallel to the reference plane, and having, in perpendicular projection on the reference plane, a bottom electrode projection;
an active layer with changeable resistivity interposed between the top electrode element and the bottom electrode element, wherein:
the top electrode projection and the bottom electrode projection overlap in an overlapping region that comprises at least one of a corner of the top electrode projection and a corner of the bottom electrode projection, and
an area of the overlapping region constitutes less than 10% of a total projected area of the top electrode element and the bottom electrode element on the reference plane;
a first level of bottom electrode programming lines electrically contacting some of the bottom electrode elements via a plurality of first bottom electrode contacts;
a second level of bottom electrode programming lines electrically contacting some of the bottom electrode elements via a plurality of second bottom electrode contacts;
the bottom electrode programming lines of the first level extending in a first direction and the bottom electrode programming lines of the second level extending in a second direction;
a third level of bottom electrode programming lines electrically contacting some of the top electrode elements via a plurality of third top electrode contacts;
a fourth level of bottom electrode programming lines electrically contacting some of the top electrode elements via a plurality of fourth top electrode contacts;
the top electrode programming lines of the third level extending in a third direction and the top electrode programming lines of the fourth level extending in a fourth direction;
a fifth level of top electrode programming lines electrically contacting some of the top electrode elements via a plurality of fifth top electrode contacts; and
a sixth level of top electrode programming lines electrically contacting some of the bottom electrode elements via a plurality of sixth bottom electrode contacts.

7. The resistive memory array of claim 6, wherein the programming lines are wire-shaped programming lines.

8. The resistive memory array of claim 6, wherein the programming lines are staircase-like connection lines.

9. The resistive memory array of claim 6, wherein the active layer comprises an insulating material.

10. A method comprising:
providing a resistive memory array comprising a plurality of resistive memory elements, each resistive memory element comprising a top electrode element lying in a plane parallel to a reference plane, a bottom electrode element lying in a plane parallel to the reference plane, and an active layer with changeable resistivity interposed between the top electrode element and the bottom electrode element, wherein a projection of the top electrode and a projection of the bottom electrode overlap in an overlapping region on the reference plane, wherein the resistive memory array further comprises:
a first level of bottom electrode programming lines electrically contacting some of the bottom electrode elements via a plurality of first bottom electrode contacts,
a second level of bottom electrode programming lines electrically contacting some of the bottom electrode elements via a plurality of second bottom electrode contacts,
the bottom electrode programming lines of the first level extending in a first direction and the bottom electrode programming lines of the second level extending in a second direction,
a third level of bottom electrode programming lines electrically contacting some of the top electrode elements via a plurality of third top electrode contacts,
a fourth level of bottom electrode programming lines electrically contacting some of the top electrode elements via a plurality of fourth top electrode contacts, and
the top electrode programming lines of the third level extending in a third direction and the top electrode programming lines of the fourth level extending in a fourth direction;
the top electrode programming lines of the third level and the top electrode programming lines of the fourth level are perpendicularly crossing; and
creating or disrupting at least one conductive filament in the active layer by applying a voltage to the top electrode and the bottom electrode.

11. The method of claim 10, wherein the at least one conductive filament comprises a conductive filament at a corner between a top electrode element of a resistive memory element and a bottom electrode element of at least one other resistive memory element.

12. The method of claim 10, wherein the at least one conductive filament comprises a conductive filament at a corner between a bottom electrode element of a resistive memory element and a top electrode element of at least one other resistive memory element.

* * * * *